(12) United States Patent
Liu et al.

(10) Patent No.: US 12,489,093 B2
(45) Date of Patent: Dec. 2, 2025

(54) MAGNETIC LED DIE TRANSFERRING DEVICE AND MAGNETIC LED DIE TRANSFERRING METHOD

(71) Applicant: INGENTEC CORPORATION, Miaoli County (TW)

(72) Inventors: Ai-Sen Liu, Miaoli County (TW); Hsiao-Lu Chen, Miaoli County (TW); Yi-Chuan Huang, Miaoli County (TW); Hsiang-An Feng, Miaoli County (TW)

(73) Assignee: INGENTEC CORPORATION, Miaoli County (TW)

( * ) Notice: Subject to any disclaimer, the term of this patent is extended or adjusted under 35 U.S.C. 154(b) by 394 days.

(21) Appl. No.: 18/190,116

(22) Filed: Mar. 26, 2023

(65) Prior Publication Data

US 2023/0369296 A1    Nov. 16, 2023

(30) Foreign Application Priority Data

May 11, 2022   (TW) .................................. 111117614

(51) Int. Cl.
*H01L 25/075* (2006.01)
*H10H 20/857* (2025.01)

(52) U.S. Cl.
CPC ....... *H01L 25/0753* (2013.01); *H10H 20/857* (2025.01)

(58) Field of Classification Search
CPC ....... H01L 25/0753; H01L 2924/12041; H01L 21/68; H01L 2224/95144; H01L 2224/9512; H10H 20/01
See application file for complete search history.

(56) References Cited

U.S. PATENT DOCUMENTS

| 11,121,283 B2* | 9/2021 | Lin .......................... H01L 24/75 |
| 11,508,872 B2* | 11/2022 | Liu .................... H10H 20/8506 |
| 2022/0139887 A1* | 5/2022 | Kim ........................ H01L 24/17 |
| | | 257/89 |

FOREIGN PATENT DOCUMENTS

| JP | H9120943 A | 5/1997 |
| JP | 2004-22846 A | 1/2004 |
| JP | 2014-90052 A | 5/2014 |
| WO | 2012/008253 A1 | 1/2012 |

* cited by examiner

*Primary Examiner* — Robert J May
(74) *Attorney, Agent, or Firm* — CKC & Partners Co., LLC

(57) ABSTRACT

A magnetic LED die transferring device includes a substrate, a plurality of magnetic members and a vibrating mechanism. The substrate includes a plurality of die locating areas arranged in intervals, and each of the die locating areas includes a locating surface. Each of the magnetic members corresponds to each of the die locating areas and includes an alignment N-pole and an alignment S-pole. The vibrating mechanism is coupled to the substrate. The N-pole and the S-pole of each of the magnetic LED dice are used to be attracted by each of the alignment N-poles and each of the alignment S-poles, respectively, to allow each of the magnetic LED dice to be transferred and aligned to each of the die locating areas.

10 Claims, 7 Drawing Sheets

MAGNETIC LED DIE TRANSFERRING DEVICE AND MAGNETIC LED DIE TRANSFERRING METHOD

RELATED APPLICATIONS

This application claims priority to Taiwan Application Serial Number 111117614, filed May 11, 2022, which is herein incorporated by reference.

BACKGROUND

Technical Field

The present disclosure relates to a transferring device and a transferring method. More particularly, the present disclosure relates to a magnetic LED die transferring device and a magnetic LED die transferring method.

Description of Related Art

LED (Light Emitting Diode) dice have the advantages of low power consumption, high luminous efficiency and long life, and are widely used in various fields.

In some fields, such as LED displays, a plurality of LED dice must be placed on a substrate, and if a traditional surface bonding technique is used, only one LED die can be transferred at a time, resulting in long operating time, and thus it is unable to meet the demands of large-scale transferring.

Given this, developing a magnetic LED die transferring device and a magnetic LED die transferring method that can perform large-scale transfers is a goal that those in the industry pursue.

SUMMARY

According to one aspect of the present disclosure, a magnetic LED die transferring device, which is used for transferring a plurality of magnetic LED dice, each of the magnetic LED dice including an N-pole and an S-pole and having a height direction, each of the N-poles and each of the S-poles being arranged substantially normal to the height direction, is provided. The magnetic LED die transferring device includes a substrate, a plurality of magnetic members and a vibrating mechanism. The substrate includes a plurality of die locating areas arranged in intervals, and each of the die locating areas includes a locating surface. Each of the magnetic members corresponds to each of the die locating areas and includes an alignment N-pole and an alignment S-pole. Each of the alignment N-poles and each of the alignment S-poles are arranged substantially parallel to each of the locating surfaces, and the alignment N-pole of one of the magnetic members corresponds to the alignment S-pole of another one of the magnetic members that is adjacent to the one of the magnetic members. The vibrating mechanism is coupled to the substrate. The N-pole and the S-pole of each of the magnetic LED dice are used to be attracted by each of the alignment S-poles and each of the alignment N-poles, respectively, to allow each of the magnetic LED dice to be transferred and aligned to each of the die locating areas. When at least one of the magnetic LED dice falls to one of the locating surfaces and the N-pole of the at least one of the magnetic LED dice is not aligned to the S-pole of the magnetic member located at the one of the locating surfaces, the vibrating mechanism vibrates the substrate to allow the at least one of the magnetic LED dice to be flipped and realigned.

According to one aspect of the present disclosure, a magnetic LED die transferring method, which is used for transferring a plurality of magnetic LED dice, each of the magnetic LED dice including an N-pole and an S-pole and having a height direction, each of the N-poles and each of the S-poles being arranged substantially normal to the height direction, is provided. The magnetic LED die transferring method includes a substrate providing step, a magnetic member providing step, a transferring step and a vibrating step. In the substrate providing step, a substrate is provided, and the substrate includes a plurality of die locating areas. In the magnetic member providing step, a plurality of magnetic members is provided to respectively correspond to the aforementioned plurality of die locating areas, the magnetic members are arranged in intervals and are inside the substrate or exposed from the substrate, each of the magnetic members includes an alignment N-pole and an alignment S-pole, each of the alignment N-poles and each of the alignment S-poles are arranged substantially parallel to a locating surface of each of the die locating areas, and the alignment N-pole of one of the magnetic members corresponds to the alignment S-pole of another one of the magnetic members that is adjacent to the one of the magnetic members. In the transferring step, the N-poles and the S-poles of each of the magnetic LED dice are allowed to be used to be attracted by each of the alignment S-poles and each of the alignment N-poles, and each of the magnetic LED dice is transferred to correspond to each of the die locating areas. In the vibrating step, the substrate is configured to be vibrated to flip at least one of the magnetic LED dice that is repulsive to the magnetic member of at least one of the die locating areas, allowing the at least one of the magnetic LED dice to be realigned.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
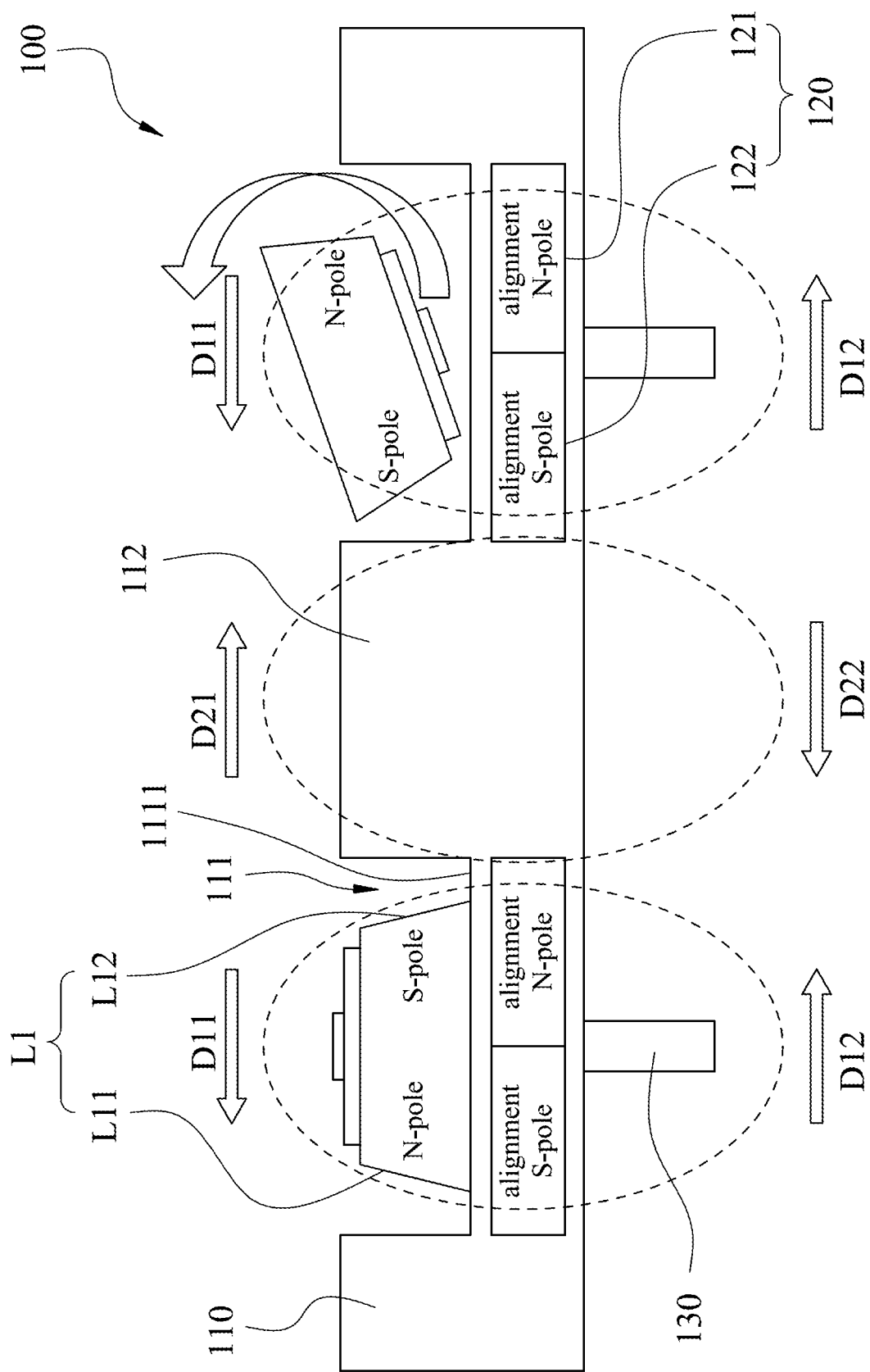
FIG. 1 shows a schematic view of a magnetic LED die transferring device and a plurality of magnetic LED dice according to the first embodiment of the present disclosure.

The embodiments will be described with the drawings. For clarity, some practical details will be described below. However, it should be noted that the present disclosure should not be limited by the practical details, that is, in some embodiments, the practical details are unnecessary. In addition, for simplifying the drawings, some conventional structures and elements will be simply illustrated, and repeated elements may be represented by the same reference numerals.

In addition, the terms first, second, third, etc. are used herein to describe various elements or components, and these elements or components should not be limited by these terms. Consequently, a first element or component discussed below could be termed a second element or component. Moreover, a combination of these elements of the present disclosure is not a common combination in this art, such that it cannot be predicted whether a relation of the combination hereof can be easily done by a person having skill in the art by these elements.

FIG. 1 shows a schematic view of a magnetic LED die transferring device 100 and a plurality of magnetic LED dice L1 according to the first embodiment of the present disclosure. As shown in FIG. 1, a magnetic LED die transferring device 100, which is used for transferring a plurality of magnetic LED dice L1, each of the magnetic LED dice L1 including an N-pole L11 and an S-pole L12 and having a height direction, each of the N-poles L11 and each of the S-poles L12 being arranged substantially normal to the height direction, is provided. The magnetic LED die transferring device 100 includes a substrate 110, a plurality of magnetic members 120 and a vibrating mechanism 130. The substrate 110 includes a plurality of die locating areas 111 arranged in intervals, and each of the die locating areas 111 includes a locating surface 1111. Each of the magnetic members 120 corresponds to each of the die locating areas 111 and includes an alignment N-pole 121 and an alignment S-pole 122. Each of the alignment N-poles 121 and each of the alignment S-poles 122 are arranged substantially parallel to each of the locating surfaces 1111, and the alignment N-pole 121 of one of the magnetic members 120 corresponds to the alignment S-pole 122 of another one of the magnetic members 120 that is adjacent to the one of the magnetic members 120. The vibrating mechanism 130 is coupled to the substrate 110. The N-pole L11 and the S-pole L12 of each of the magnetic LED dice L1 are used to be attracted by each of the alignment S-poles 122 and each of the alignment N-poles 121, respectively, to allow each of the magnetic LED dice L1 to be transferred and aligned to each of the die locating areas 111. When at least one of the magnetic LED dice L1 falls to one of the locating surfaces 1111 and the N-pole L11 of the at least one of the magnetic LED dice L1 is not aligned to the S-pole L12 of the magnetic member 120 located at the one of the locating surfaces 1111, the vibrating mechanism 130 vibrates the substrate 110 to allow the at least one of the magnetic LED dice L1 to be flipped and realigned.

Therefore, based on the arrangement and directional relationship of the alignment N-poles 121 and the alignment S-poles 122 of the magnetic member 120, the magnetic LED dice L1 can be substantially transferred by the principle of magnetic attraction, and an effect of transferring large quantities of the magnetic LED dice L1 at a time can be achieved. Furthermore, by the vibrating mechanism 130 vibrating the substrate 110, the magnetic LED dice L1 that are not aligned can be flipped and realigned, not only having ease of use, but also improving efficiency of alignment. Details of the magnetic LED die transferring device 100 are described below.

Each of the magnetic LED dice L1 can include an epitaxy layer and a magnetic metal plate. The epitaxy layer is disposed on the magnetic metal plate. The magnetic metal plate can for example include a nickel-iron alloy layer and a copper layer, and can have a high thermal conductivity, a low thermal expansion coefficient, a low initial magnetic conductivity and a weak magnetic field. Also, a magnetic direction of the weak magnetic field is horizontally arranged.

The substrate 110 can be a transparent substrate or an insulated substrate, each of the die locating areas 111 can have a grooved structure, the bottom of the grooved structure can form each of the locating surfaces 1111, and each of the die locating areas 111 can be separated by a spacing region 112. In the first embodiment, the magnetic members 120 can have a magnetic structure, which can be disposed inside the substrate 110, and in other embodiments, a plurality of magnetic members can be exposed from a substrate, but the present disclosure is not limited thereto.

The magnetic members 120 are horizontally arranged and can generate a plurality of magnetic forces, a magnetic field line tangential direction D11 can be above the locating surfaces 1111, a magnetic field line tangential direction D12 can be below the locating surfaces 1111, a magnetic field line tangential direction D21 can be above the spacing regions 112, and a magnetic field line tangential direction D22 can be below the spacing regions 112. As shown in FIG. 1, the magnetic field line tangential directions D11, D21 can be opposite to each other and can be mutually repulsive, thereby contributing a separation of the magnetic LED dice L1. In other words, due to the magnetic field of the magnetic LED dice L1 being horizontally arranged, a problem of horizontal attraction and connection may arise, which is to say, the magnetic LED die L1 may connect with each other and not easily separated from each other, and by configuring the magnetic field line tangential direction D11 above the die locating areas 111 to be oppose to the magnetic field line tangential direction D21 above the spacing regions 112, a separation of the magnetic LED dice L1 that are connected during the transferring can be contributed.

The vibrating mechanism 130 can have a vibrating rod structure, and can be configured with components such as a motor and an eccentric block to cause a vibration, and can vibrate the substrate 110. In other embodiments, the substrate can connect to a mechanical arm and be vibrated through the mechanical arm, but the present disclosure is not limited thereto. During the transferring of the magnetic LED dice, some of the magnetic LED dice L1 may be inverted when falling into the die locating areas 111, that is to say, the S-pole L12 of each of the aforementioned some of the magnetic LED dice L1 may be aligned with the alignment S-pole 122 of the magnetic members 120, causing the aforementioned some of the magnetic LED dice L1 to be unable to be attracted and be stabilized by the magnetic members 120 due to being mutually repulsive, and the aforementioned some of the magnetic LED dice L1 may remain in a movable state. In this case, if the vibrating mechanism 130 vibrates the substrate 110 up and down, then the magnetic LED dice that are in the movable state can be bounced and flipped, and can realign, and the magnetic LED dice that are able to be attracted and stabilized by the magnetic members 120 can be unaffected, and remain stable.

Furthermore, each of the magnetic LED dice L1 can have a bottom surface which is substantially square. That is to say, a length and a width of the bottom surface of one of the magnetic LED dice L1 can be substantially equal, and one of the die locating areas 111 can also correspond to the one of the magnetic LED dice L1 to have the one of the locating surface 1111 with substantially equal length and width, such that the one of the magnetic LED dice L1 can fall to the one of the die locating areas 111 more easily.

Figure 2:
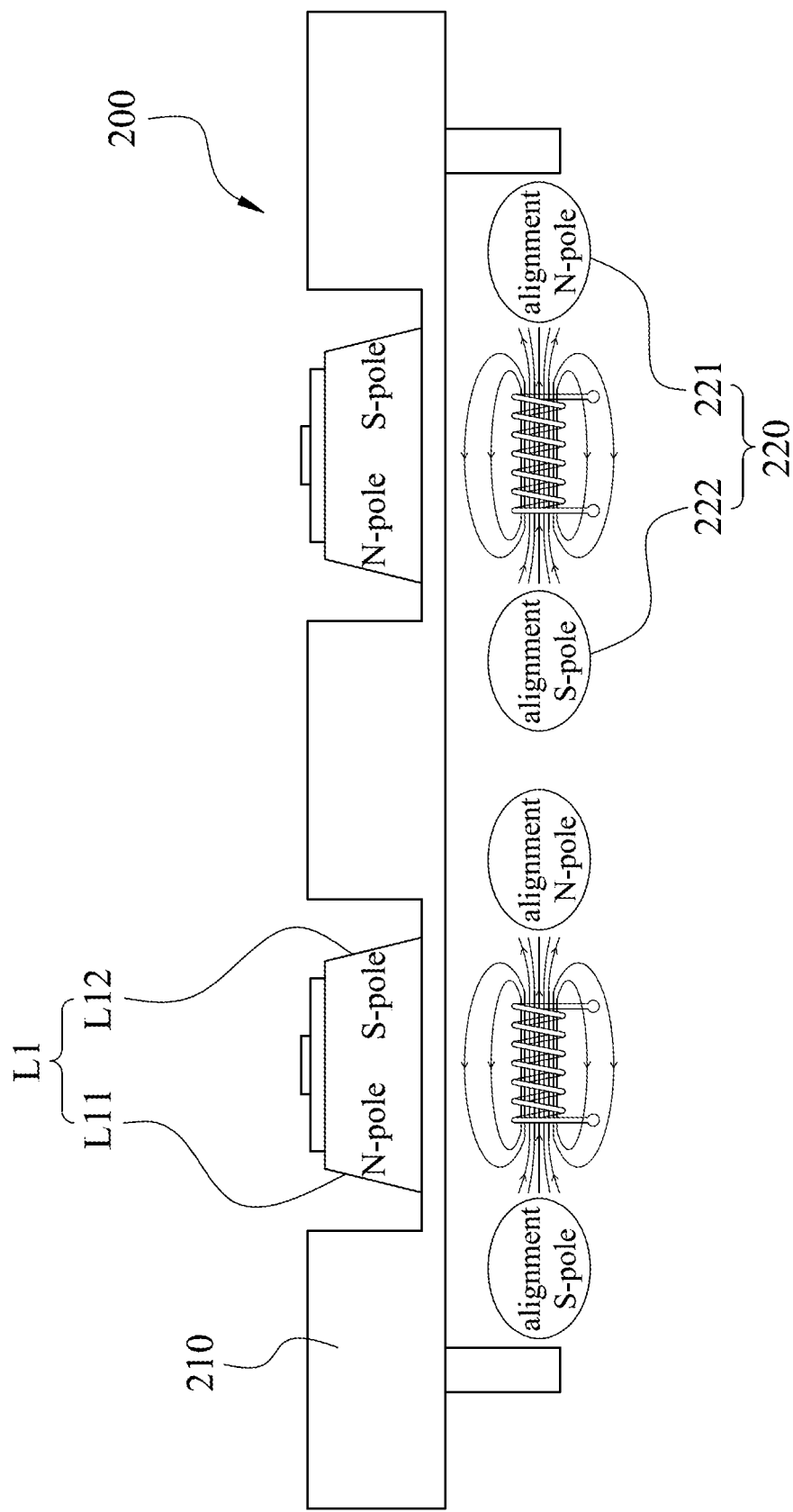
FIG. 2 shows a schematic view of a magnetic LED die transferring device and a plurality of magnetic LED dice according to the second embodiment of the present disclosure.

FIG. 2 shows a schematic view of a magnetic LED die transferring device 200 and a plurality of magnetic LED dice L1 according to the second embodiment of the present disclosure. The magnetic LED die transferring device 200 of the second embodiment is similar to the magnetic LED die transferring device 100 of the first embodiment, but a plurality of magnetic members 220 is exposed from a substrate 210, and each of the magnetic members 220 can have an electromagnet structure. As shown in FIG. 2, each of the magnetic members 220 can be wound by a coil and powered by a current, and can form an alignment N-pole 221 and an alignment S-pole 222. The alignment N-poles 221 and the alignment S-poles 222 are horizontally arranged, and can be of a substantially parallel direction with the N-pole L11 and the S-pole L12 of the magnetic LED dice L1, to have an attracting and stabilizing effect. A value of the magnetic field of the magnetic members 220 can be achieved via a value of the current or a number of turns of the coil, and a magnetic direction can be changed via a direction of the current, which is advantageous in terms of ease of configuration.

Figure 3:
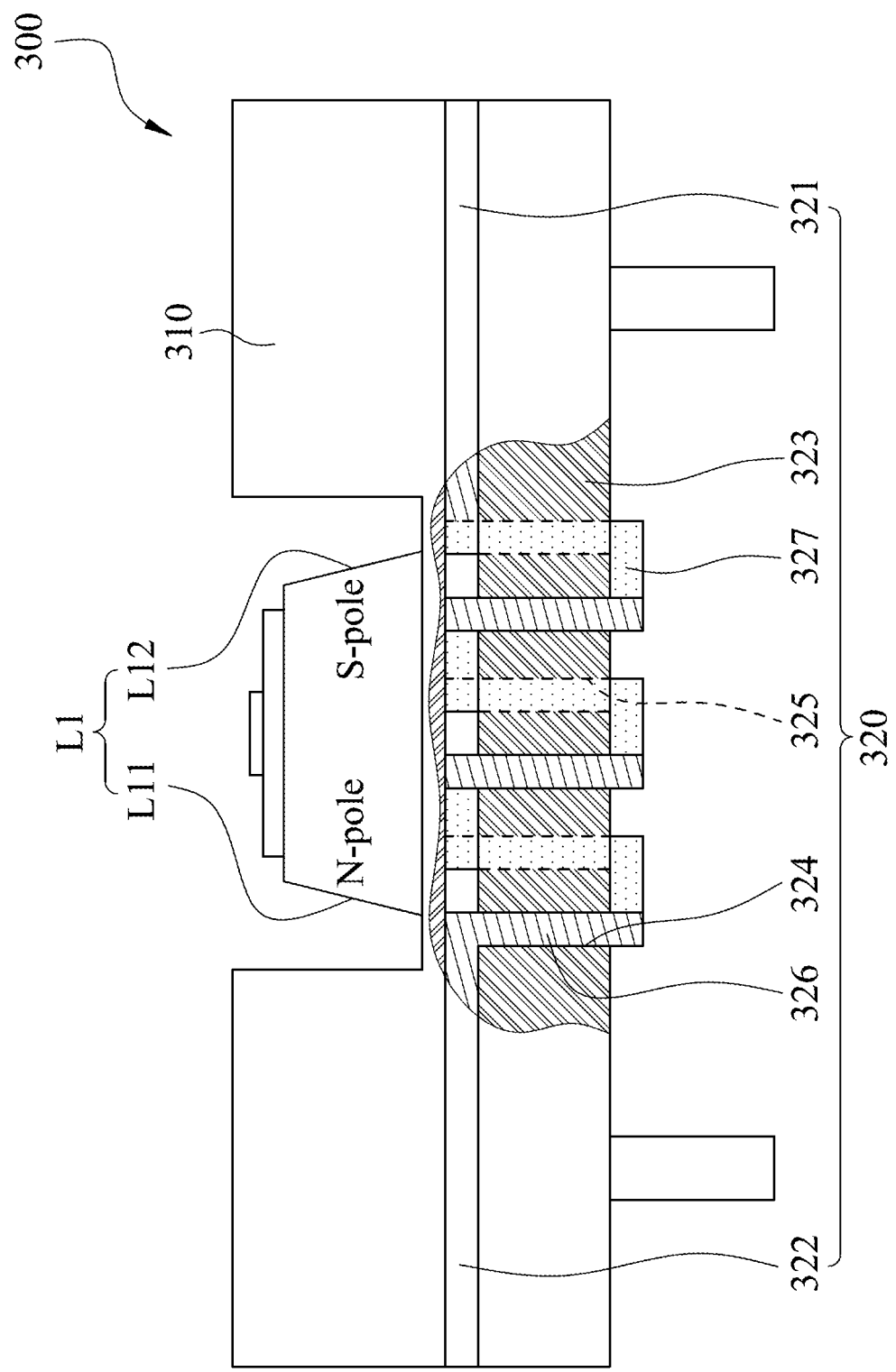
FIG. 3 shows a partial sectional schematic view of a magnetic LED die transferring device and a magnetic LED die according to the third embodiment of the present disclosure.
Figure 4:
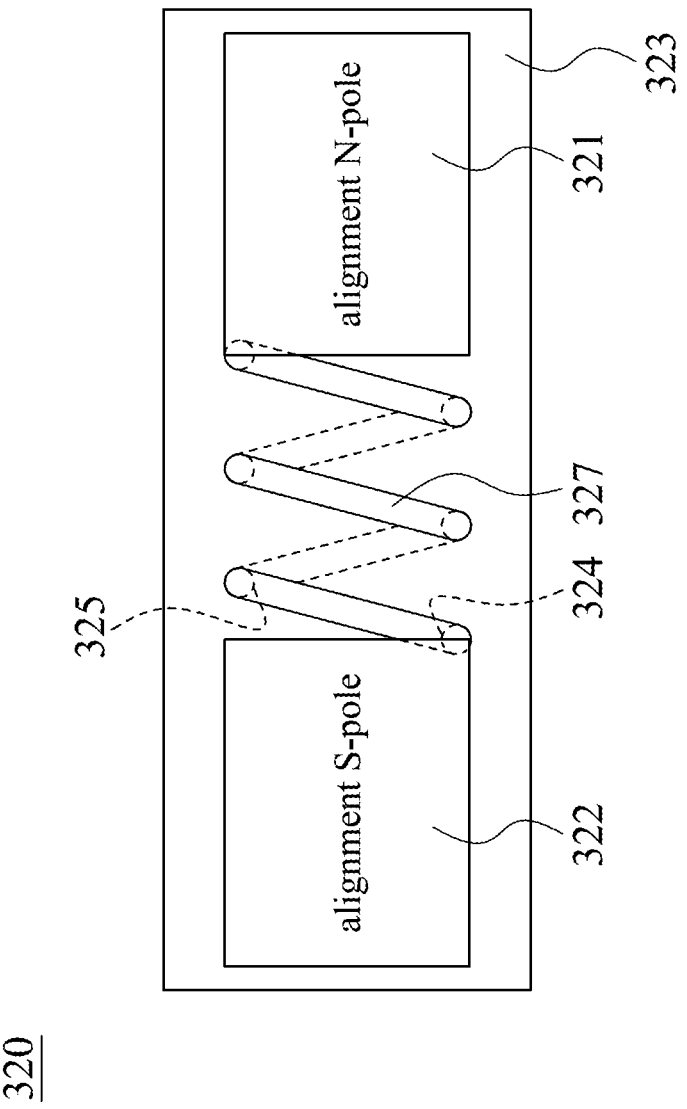
FIG. 4 shows a top schematic view of a magnetic member of the magnetic LED die transferring device according to the third embodiment of the present disclosure of FIG. 3.

FIG. 3 shows a partial sectional schematic view of a magnetic LED die transferring device 300 and a magnetic LED die L1 according to the third embodiment of the present disclosure. FIG. 4 shows a top schematic view of a magnetic member of the magnetic LED die transferring device 300 according to the third embodiment of the present disclosure of FIG. 3. As shown in FIG. 3 and FIG. 4, in the magnetic LED transferring die device 300, each of the magnetic members 320 can also have an electromagnet structure, and each of the magnetic members 320 includes a glass plate 323, a plurality of first through-holes 324, a plurality of second through-holes 325, a plurality of first conductive parts 326 and a plurality of second conductive parts 327. The glass plate 323 is disposed beneath the substrate 310. The first through-holes 324 penetrate the glass plate 323 and are arranged equidistantly from each other. The second through-holes 325 penetrate the glass plate 323 and are arranged equidistantly from each other, and the second through-holes 325 and the first through-holes 324 are alternately arranged but are not collinear. Each of the first conductive parts 326 is filled into each of the first through-holes 324 and each of the second through-holes 325. The second conductive parts 327 are located at the surface of the glass plate 323, each of the second conductive parts 327 connects to the first conductive part 326 located at each of the first through-holes 324 and the first conductive part 326 located at each of the second through-holes 325, and the first conductive parts 326 and the second conductive parts 327 are connected to form a spiral structure. In this case, the alignment N-poles 321 and the alignment S-poles 322 are horizontally arranged, and can be of a substantially parallel direction with the N-pole L11 and the S-pole L12 of the magnetic LED dice L1 to have the attracting and stabilizing effect.

Specifically, as shown in FIG. 3 and FIG. 4, the glass plate 323 may, for example, include three first through-holes 324 and three second through-holes 325, the three first through-holes 324 are arranged in a row horizontally, the three second through-holes 325 are arranged in another row horizontally, and each of the first through-hole 324 and each of the second through-holes 325 are not collinear vertically. A material of the first conducting parts 326 and the second conductive parts 327 can be copper for example, that is to say, the first conductive parts 326 can be used to be disposed in the first through-holes 324 and the second through-holes to form a conductive hole (via) structure, and the second conductive parts 327 are used to be disposed at an upper surface and an lower surface of the glass plate 323, ultimately forming a spiral coil structure. By electrically powering the spiral coil structure, an alignment S-pole 322 and an alignment N-pole 321 are formed. In the third embodiment, the glass plate 323 may further have a short-circuit prevention effect for the magnetic members 320. Please note, although the number of the turns of the coil formed by the first conductive parts 326 and the second conductive parts 327 is three in FIG. 3 and FIG. 4, the number of the turns of the coil can be changed based on a magnetic field line requirement, and the present disclosure is not limited by the drawings.

Figure 5:
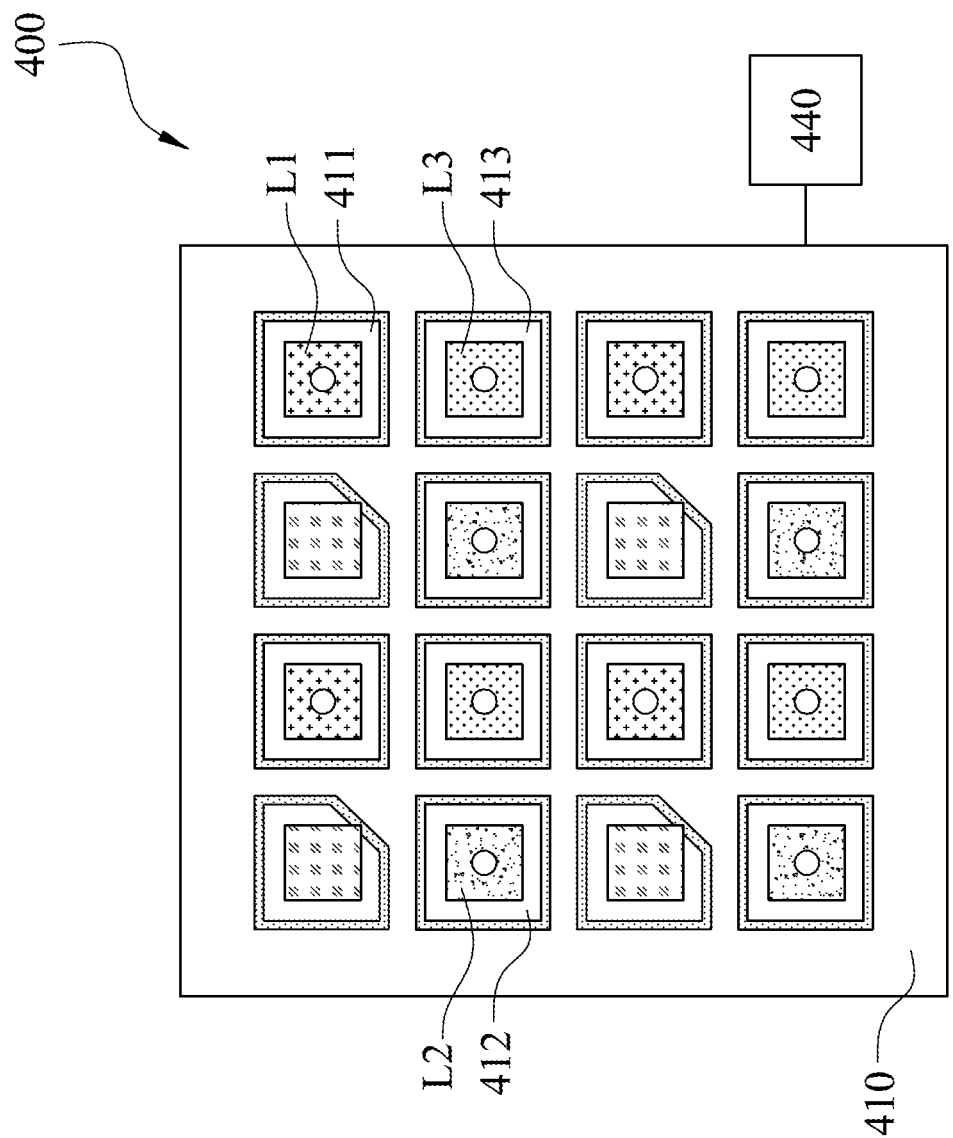
FIG. 5 show a top view of a magnetic LED transferring device and a plurality of magnetic LED dice according to the fourth embodiment of the present disclosure.
Figure 6:
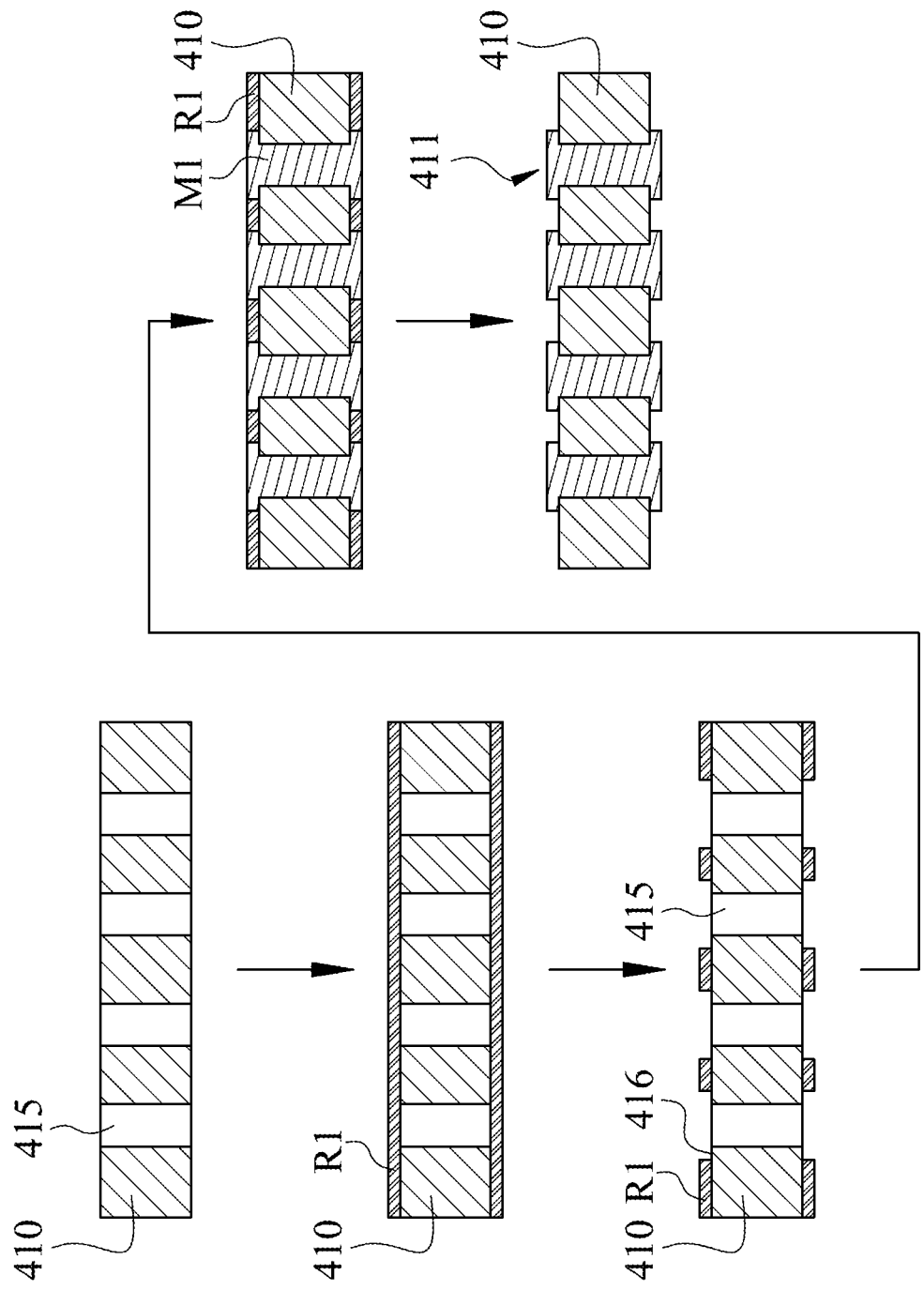
FIG. 6 shows a formation diagram of a substrate of the magnetic LED transferring device according to the fourth embodiment of the present disclosure.

FIG. 5 show a top view of a magnetic LED transferring device 400 and a plurality of magnetic LED dice L1, L2, L3 according to the fourth embodiment of the present disclosure. FIG. 6 shows a formation diagram of a substrate 410 of the magnetic LED transferring device 400 according to the fourth embodiment of the present disclosure. As shown in FIG. 5 and FIG. 6, the substrate 410 of the magnetic LED transferring device 400 can include a plurality of die locating areas 411, 412, 413 used to dispose the magnetic LED dice L1, L2, L3, the magnetic LED die L1 emits a first light color such as a red light color, the magnetic LED die L2 emits a second light color such as a green light color, and the magnetic LED die L3 emits a third light color such as a blue light color.

As shown in FIG. 5 and FIG. 6, a plurality of via-holes 415 is formed on the substrate 410 first, then a photoresist R1 is coated on the substrate 410, and after exposing and etching, a plurality of metal locating areas 416 for respectively connecting to the aforementioned plurality of via-holes 415 is formed. Subsequently, each of the metal locating areas 416 and each of the via-holes 415 are filled with a metal material M1 to form each of the die locating areas 411, 412, 413. In other embodiments, a substrate can be provided by other means, but the present disclosure is not limited thereto.

Referring to FIG. 5 again, each of the die locating areas 411, 412, 413 can correspond to a magnetic member (not shown in FIG. 5), the magnetic LED transferring device 400 may further include a controller 440 electrically connected to the magnetic members, and the controller 440 is used to turn on each of the magnetic members to generate a magnetic force, or to turn off each of the magnetic members to eliminate the magnetic force. In other words, as each of the magnetic members can have an electromagnet structure, each of the magnetic members can be electrically powered to generate the magnetic force, and when each of the magnetic members is not electrically powered, each of the magnetic members does not generate the magnetic force. Thus, the controller 440 can be used to control the magnetic members to choose the die locating areas 411, 412, 413 that are required, and therefore to dispose the magnetic LED dice L1, L2, L3 that are required.

For example, first, the magnetic members that correspond to the die locating areas 411 can be turned on, and large quantities of the magnetic LED dice L1 are allowed to be transferred and attracted to the die locating areas 411; next, the magnetic members that correspond to the die locating areas 411, 412 can be turned on, and large quantities of the magnetic LED dice L2 are allowed to be transferred and attracted to the die locating areas 412; lastly, turning on all of the magnetic members that correspond to the die locating areas 411, 412, 413, and large quantities of the magnetic LED dice L3 are allowed to be transferred and attracted to the die locating areas 413.

Figure 7:
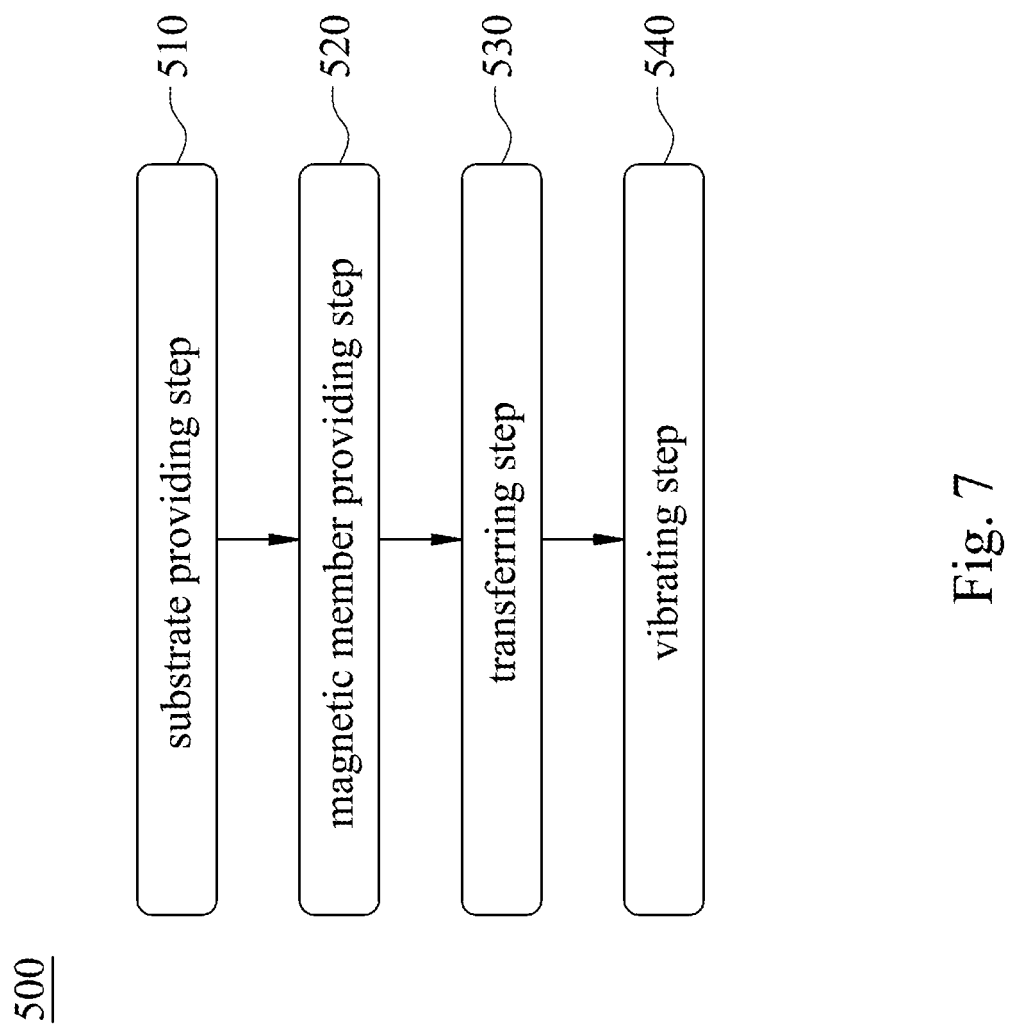
FIG. 7 shows a block flow diagram of a magnetic LED die transferring method according to the fifth embodiment of the present disclosure.

FIG. 7 shows a block flow diagram of a magnetic LED die transferring method 500 according to the fifth embodiment of the present disclosure. Details of the magnetic LED die transferring method 500 will be described with the magnetic LED die transferring device 100 of FIG. 1. As shown in FIG. 7, the magnetic LED die transferring method 500, which is used for transferring a plurality of magnetic LED dice L1, each of the magnetic LED dice L1 including an N-pole L11 and an S-pole L12 and having a height direction, each of the N-poles L11 and each of the S-poles L12 being arranged substantially normal to the height direction, is provided. The magnetic LED die transferring method 500 includes a substrate providing step 510, a magnetic member providing step 520, a transferring step 530 and a vibrating step 540.

In the substrate providing step 510, a substrate 110 is provided, and the substrate 110 includes a plurality of die locating areas 111.

In the magnetic member providing step 520, a plurality of magnetic members 120 is provided to respectively correspond to the aforementioned plurality of die locating areas 111, the magnetic members 120 are arranged in intervals and are inside the substrate 110, each of the magnetic members 120 includes an alignment N-pole 121 and an alignment S-pole 122, each of the alignment N-poles 121 and each of the alignment S-poles 122 are arranged substantially parallel to a locating surface 1111 of each of the die locating areas 111, and the alignment N-pole 121 of one of the magnetic members 120 corresponds to the alignment S-pole 122 of another one of the magnetic members 120 that is adjacent to the one of the magnetic members 120.

In the transferring step 530, the N-poles L11 and the S-poles L12 of each of the magnetic LED dice L1 are allowed to be used to be attracted by each of the alignment S-poles 122 and each of the alignment N-poles 121, and each of the magnetic LED dice L1 is transferred to correspond to each of the die locating areas 111.

In the vibrating step 540, the substrate 110 is configured to be vibrated to flip at least one of the magnetic LED dice L1 that is repulsive to the magnetic member 120 of at least one of the die locating areas 111, allowing the at least one of the magnetic LED dice L1 to be realigned.

Specifically, in the substrate providing step 510, the die locating areas 111 are arranged in intervals, and each of the die locating areas 111 has a grooved structure and has a containment region. In the magnetic member providing step 520, the magnetic members 120 can have a magnet structure, and can be disposed inside the substrate 110 during a formation of the substrate 110 and corresponds to the locating surface 1111 of each of the die locating areas 111. A configuration of the second embodiment of FIG. 2 can also be referenced, in which the magnetic members 220 have an electromagnet structure, and are exposed from the substrate 210.

Initially, in the transferring step 530, many magnetic LED dice L1 can be provided and may be in a movable state with connecting each other owing to not being attracted by the magnetic members 120. Then, each of the magnetic LED dice L1 can be attracted by the magnetic member 120 and fall into the containment region of each of the die locating areas 111. If one of the magnetic LED dice L1 is inverted when falling to the die locating area 111, the S-pole L12 of the one of the magnetic LED dice L1 may be repulsive to the alignment S-pole 122 of the magnetic member 120. Therefore, in the vibrating step 540, the substrate 110 is vibrated up and down to allow the one of the magnetic LED dice L1 to detach from the containment region and then fall back to the containment region, and through a vibration of the magnetic LED dice L1 and a magnetically repulsive relationship between the magnetic LED dice L1 and the magnetic members 120, transferring and realigning the magnetic LED dice L1 are achieved.

As shown in FIG. 5 and FIG. 7, the substrate 410 is made of a glass material, and the substrate providing step 510 can include: forming a plurality of via-holes 415 on the substrate 410; coating, exposing and etching a photoresist R1 on the substrate 410 to form a plurality of metal locating areas 416 for respectively connecting to the aforementioned plurality of via-holes 415; and filling each of the metal locating areas 416 and each of the via-holes 415 with a metal material M1 to form each of the die locating areas 411, 412, 413.

The magnetic LED dice L1, L2, L3 can emit a variety of light colors, the magnetic LED die L1 emits a first light color such as a red light color, the magnetic LED die L2 emits a second light color such as a green light color, and the magnetic LED die L3 emits a third light color such as a blue light color. Therefore, in the transferring step 530, a first group of the magnetic members can be turned on, i.e., turning on the magnetic members that correspond to the die locating areas 411, to generate magnetic forces, and the first amount of the magnetic LED dice emitting the first light color may be allowed be attracted and aligned; next, keeping the first group of the magnetic members being turned on, and a second group of the magnetic members can be turned on, i.e., turning on the magnetic members that correspond to the die locating areas 411, 412, to generate magnetic forces, and the second amount of the magnetic LED dice emitting the second light color may be allowed to be attracted and aligned; lastly, turning on all of the magnetic members, i.e., turning on the magnetic members that correspond to the die locating areas 411, 412, 413, and the third amount of the magnetic LED dice emitting the third light color may be allowed to be attracted and aligned. As such, the magnetic LED dice L1, L2, L3 can be disposed to the die locating areas 411, 412, 413. It is worth to be noted that the vibrating step 540 can be executed until all of the magnetic LED dice L1 are aligned completely, and similarly, the vibrating step 540 can be executed to dispose the magnetic LED dice L2. Detailed descriptions will not be rewritten hereafter.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A magnetic LED die transferring device, which is used for transferring a plurality of magnetic LED dice, each of the magnetic LED dice comprising an N-pole and an S-pole and having a height direction, each of the N-poles and each of the S-poles being arranged substantially normal to the height direction, the magnetic LED die transferring device comprising:

a substrate comprising a plurality of die locating areas arranged in intervals, wherein each of the die locating areas comprises a locating surface;

a plurality of magnetic members, each of the magnetic members corresponding to each of the die locating areas and comprising an alignment N-pole and an alignment S-pole, wherein each of the alignment N-poles and each of the alignment S-poles are arranged substantially parallel to each of the locating surfaces, and the alignment N-pole of one of the magnetic members corresponds to the alignment S-pole of another one of the magnetic members that is adjacent to the one of the magnetic members; and a vibrating mechanism coupled to the substrate;

wherein the N-pole and the S-pole of each of the magnetic LED dice are used to be attracted by each of the alignment S-poles and each of the alignment N-poles, respectively, to allow each of the magnetic LED dice to be transferred and aligned to each of the die locating areas; when at least one of the magnetic LED dice falls to one of the locating surfaces and the N-pole of the at least one of the magnetic LED dice is not aligned to the S-pole of the magnetic member located at the one of the locating surfaces, the vibrating mechanism vibrates the substrate to allow the at least one of the magnetic LED dice to be flipped and realigned.

2. The magnetic LED die transferring device of claim 1, wherein each of the magnetic members has a magnet structure.

3. The magnetic LED die transferring device of claim 1, wherein each of the magnetic members has an electromagnet structure.

4. The magnetic LED die transferring device of claim 3, wherein each of the magnetic members further comprises:
   a glass plate disposed beneath the substrate;
   a plurality of first through-holes penetrating the glass plate and being arranged equidistantly from each other;
   a plurality of second through-holes penetrating the glass plate and being arranged equidistantly from each other, wherein the second through-holes and the first through-holes are alternately arranged but are not collinear;
   a plurality of first conductive parts, each of the first conductive parts being filled into each of the first through-holes and each of the second through-holes; and
   a plurality of second conductive parts located at a surface of the glass plate, each of the second conductive parts connecting to the first conductive part located at each of the first through-holes and the first conductive part located at each of the second through-holes;
   wherein the first conductive parts and the second conductive parts are connected to form a spiral structure.

5. The magnetic LED die transferring device of claim 3, further comprising a controller electrically connected to the magnetic members, wherein the controller is used to turn on each of the magnetic members to generate a magnetic force, or to turn off each of the magnetic members to eliminate the magnetic force.

6. The magnetic LED die transferring device of claim 1, wherein each of the magnetic LED dice has a bottom surface which is substantially square.

7. A magnetic LED die transferring method, which is used for transferring a plurality of magnetic LED dice, each of the magnetic LED dice comprising an N-pole and an S-pole and having a height direction, each of the N-poles and each of the S-poles being arranged substantially normal to the height direction, the magnetic LED die transferring method comprising:

a substrate providing step, wherein a substrate is provided, and the substrate comprises a plurality of die locating areas;

a magnetic member providing step, wherein a plurality of magnetic members is provided to respectively correspond to the plurality of die locating areas, the magnetic members are arranged in intervals and are inside the substrate or exposed from the substrate, each of the magnetic members comprises an alignment N-pole and an alignment S-pole, each of the alignment N-poles and each of the alignment S-poles are arranged substantially parallel to a locating surface of each of the die locating areas, and the alignment N-pole of one of the magnetic members corresponds to the alignment S-pole of another one of the magnetic members that is adjacent to the one of the magnetic members;

a transferring step, wherein the N-poles and the S-poles of each of the magnetic LED dice are allowed to be used to be attracted by each of the alignment S-poles and each of the alignment N-poles, and each of the magnetic LED dice is transferred to correspond to each of the die locating areas; and a vibrating step, wherein the substrate is configured to be vibrated to flip at least one of the magnetic LED dice that is repulsive to the magnetic member of at least one of the die locating areas, allowing the at least one of the magnetic LED dice to be realigned.

8. The magnetic LED die transferring method of claim 7, wherein, in the substrate providing step, the substrate is made of a glass material, and the substrate providing step comprising:
   forming a plurality of via-holes on the substrate;
   coating, exposing and etching a photoresist on the substrate to form a plurality of metal locating areas for respectively connecting to the via-holes; and
   filling each of the metal locating areas and each of the via-holes with a metal material to form each of the die locating areas.

9. The magnetic LED die transferring method of claim 7, wherein, a first amount of the magnetic LED dice emits a first light color, a second amount of the magnetic LED dice emits a second light color, a third amount of the magnetic LED dice emits a third light color, and in the transferring step, first, a first group of the magnetic members is turned on to generate magnetic forces, and the first amount of the magnetic LED dice emitting the first light color is allowed be attracted and aligned; next, keeping the first group of the magnetic members being turned on, and a second group of the magnetic members is turned on to generate magnetic forces, and the second amount of the magnetic LED dice emitting the second light color is allowed to be attracted and aligned; lastly, turning on all of the magnetic members, and the third amount of the magnetic LED dice emitting the third light color is allowed to be attracted and aligned.

10. The magnetic LED die transferring method of claim 7, wherein, each of the die locating areas has a grooved structure and has a containment region, and in the vibrating step, the substrate is vibrated up and down to allow the at least one magnetic LED dice to detach from the containment region and then fall back to the containment region.

* * * * *